United States Patent

Mills et al.

[11] Patent Number: 6,134,113
[45] Date of Patent: Oct. 17, 2000

[54] ENERGY ABSORBING VISCOELASTIC SPACER FOR REDUCING VIBRATION TO DISK DRIVES

[76] Inventors: Richard E. Mills, 4255 Three Graces Dr., Colorado Springs, Colo. 80904; Ewaryst Z. Polch, 19635 Top of the Moor Dr., Monument, Colo. 80132; Nanjappa Bakthavachalam, 7410 Julynn Rd., Colorado Springs, Colo. 80919; Theodore Ernst Bruning, 14550 Timberedge La., Colorado Springs, Colo. 80921

[21] Appl. No.: 08/927,101

[22] Filed: Aug. 28, 1997

[51] Int. Cl.[7] .............................. G06F 1/16; H05K 5/02; F16F 7/00
[52] U.S. Cl. .......................... 361/725; 248/638; 361/679
[58] Field of Search .................... 361/684, 685, 361/725, 727; 248/634, 636, 638; 360/97.01, 97.02

[56] References Cited

U.S. PATENT DOCUMENTS

| | | | |
|---|---|---|---|
| 4,705,257 | 11/1987 | Leo et al. | 248/611 |
| 5,164,542 | 11/1992 | Hart | 174/35 |
| 5,483,397 | 1/1996 | Gifford et al. | 360/97.01 |
| 5,491,598 | 2/1996 | Stricklin et al. | 360/106 |

*Primary Examiner*—Leo P. Picard
*Assistant Examiner*—John D. Reed

[57] ABSTRACT

The viscoelastic spacer is made of a layer of viscoelastic material and a layer of wear-resistant, low coefficient of friction material which together form a unitary structure for damping vibration. Spacers are placed at the top and bottom of a storage module containing a disk drive. Upon slidable insertion of the storage module into an enclosure, features on the inner surface of the enclosure engage with the spacer in a way which subjects the spacer to both compression and shear forces generated by vibration of the disk drive and of other vibration sources in the environment of the storage module.

9 Claims, 5 Drawing Sheets

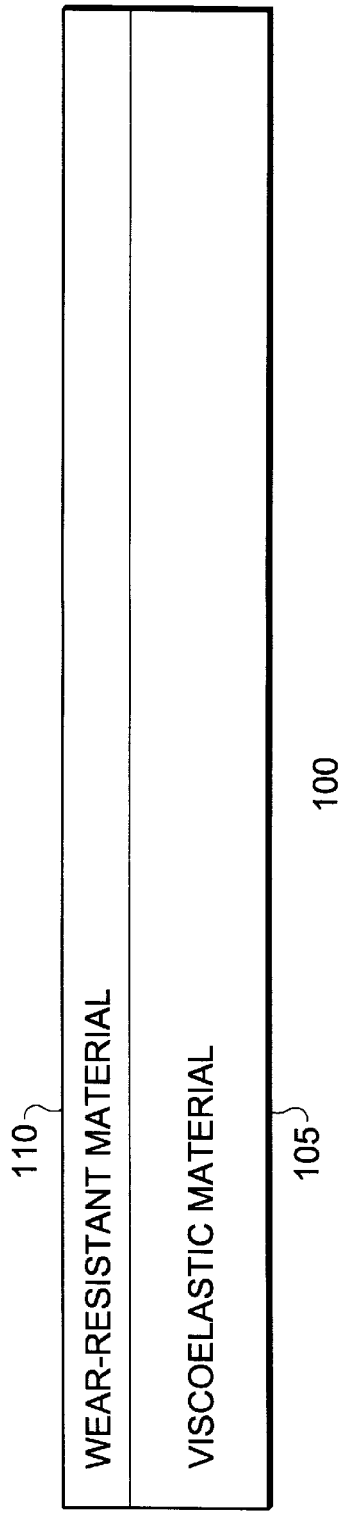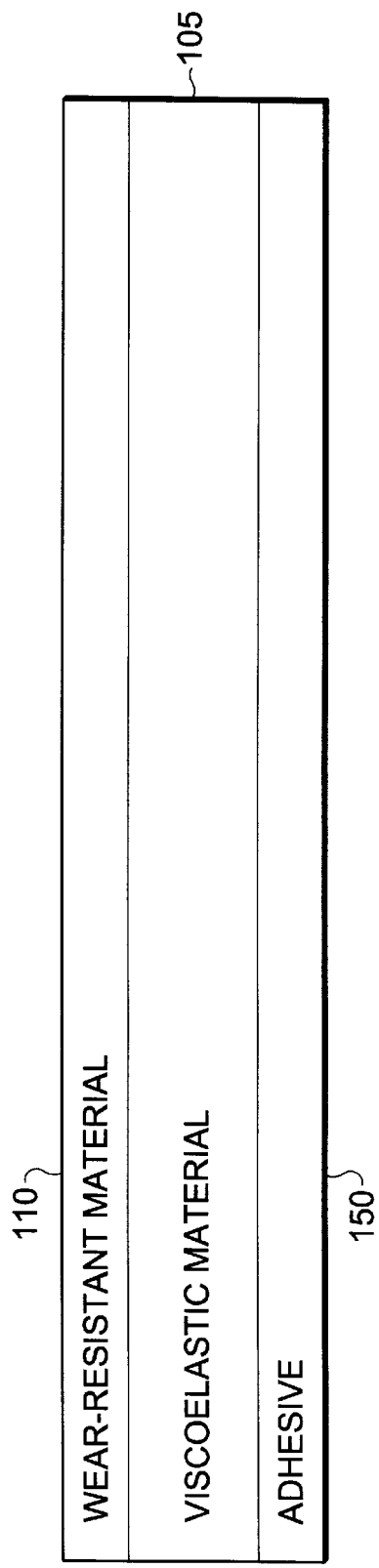

ENERGY ABSORBING VISCOELASTIC SPACER FOR REDUCING VIBRATION TO DISK DRIVES

FIELD OF THE INVENTION

This invention relates generally to damping vibration, and more particularly to damping vibration of a disk drive installed in a computer system in order to improve disk drive performance.

BACKGROUND OF THE INVENTION

A disk drive is subject to vibration which may cause errors in data storage operations. The disk drive is typically contained in a housing structure. The disk drive and the housing structure together are referred to as a storage module. One or more storage modules may be installed in a storage shelf, cabinet, or other enclosure to form a storage subsystem. The sources of vibration may be the disk drive itself, adjacent disk drives in the storage subsystem or other sources internal or external to the enclosure.

The linear and rotary vibration of the disk drive can cause the recording head inside the drive to be off-position. The results of this vibration may include error conditions, such as re-attempted read and write operations, and data corruption. Re-attempted read and write operations increase the latency of the storage system. As storage density on disks increases, so does the probability of data corruption.

Prior art solutions to the vibration problem include friction pads placed on the sides of the storage module in order to reduce the movement of the storage module within the subsystem enclosure. In another attempted solution, plastic shims were inserted between the storage module and the enclosure in which the storage module was installed in order to reduce clearance spaces. Other items which were used to fill the clearance space and reduce vibration include coiled springs and pieces of folded cardboard. Another method for reducing vibration involved inserting foam button-shaped pads between the disk drive and the internal surfaces of the housing structure in which it was installed.

It remains desirable to have a means of damping disk drive vibration.

SUMMARY OF THE INVENTION

The problems of disk drive vibration are solved by the present invention of a viscoelastic spacer.

The viscoelastic spacer is made of a layer of viscoelastic material and a layer of wear-resistant, low coefficient of friction material which together form a unitary structure for damping vibration. Spacers are placed at the top and bottom of a storage module. Upon slidable insertion of the storage module into an enclosure, features on the inner surface of the enclosure engage with the spacer in a way which subjects the spacer to both compression and shear forces generated by vibration of a disk drive in the storage module and other sources of vibration internal and external to the storage module.

BRIEF DESCRIPTION OF THE DRAWINGS

The present invention together with the above and other advantages may best be understood from the following detailed description of the embodiments of the invention illustrated in the drawings, wherein:

FIG. 2 is a side view of one of the viscoelastic spacers of FIG. 1;

FIG. 3 is a side view illustrating the viscoelastic spacer with an adhesive layer;

DETAILED DESCRIPTION

Figure 1:
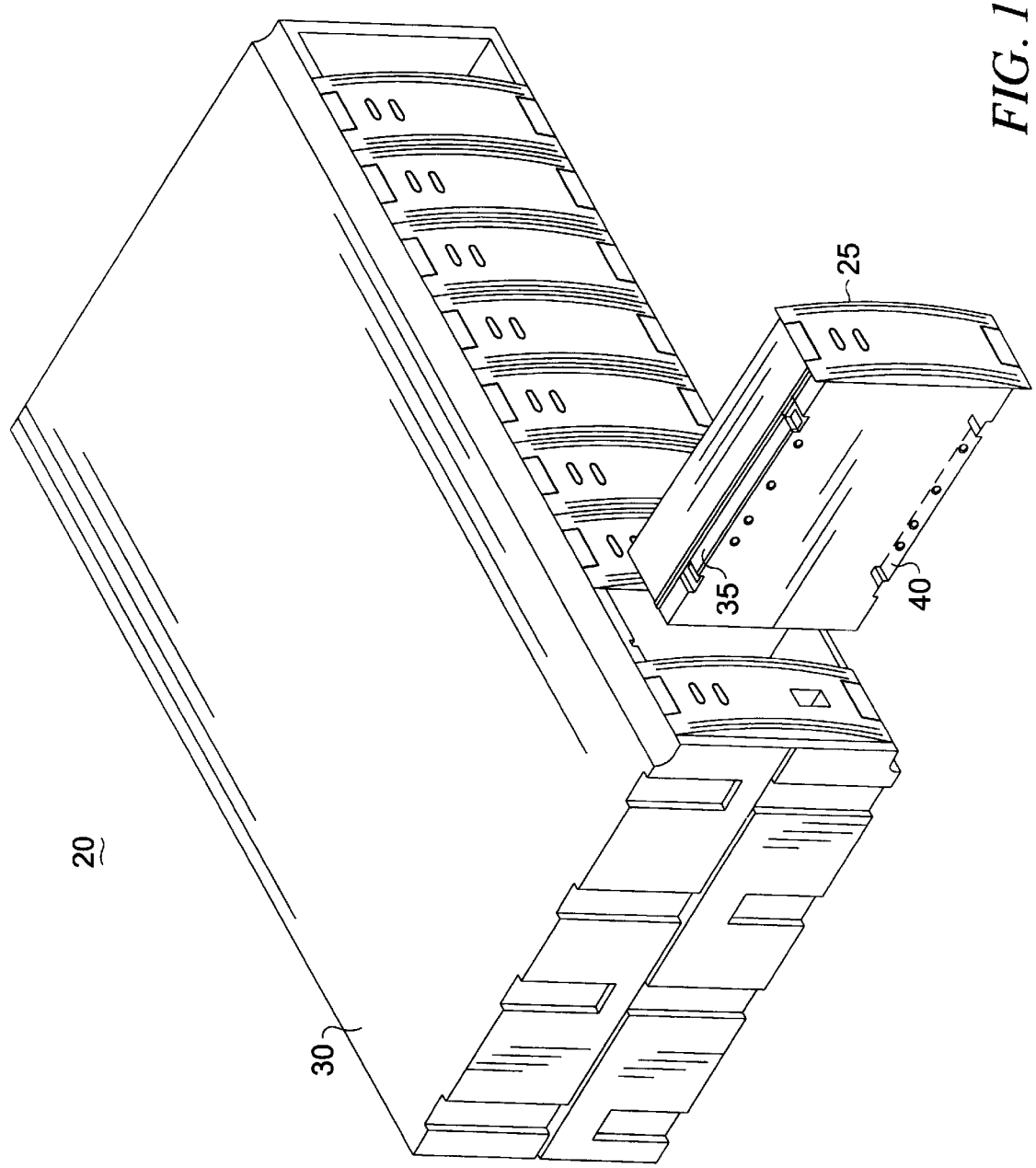
FIG. 1 is a perspective view illustrating a storage subsystem having a plurality of storage modules utilizing viscoelastic spacers.

FIG. 1 shows a storage subsystem 20 having a plurality of storage modules with one exemplary storage module 25 pulled out of the storage subsystem enclosure 30. A first viscoelastic spacer 35 is attached to the top surface of the exemplary storage module 25 and a second viscoelastic spacer 40 (shown in dotted line) is attached on the bottom surface of the exemplary storage module 25.

As shown in FIG. 2, the viscoelastic spacer 100 is formed by a layer of viscoelastic material 105, such as the ISD-112 viscoelastic material manufactured by the 3M Corporation, and by a layer of wear-resistant material 110. Alternative materials include Very High Bonding (VHB) material, double-coated acrylic foam from the 3M Corporation.

Viscoelastic materials exhibit both viscous and elastic properties. The viscous material behavior is characterized by the resistance to deformation in proportion to the rate of deformation. The viscous material behavior is associated with energy dissipation. The elastic material behavior is characterized by its resistance to deformation proportional to the deformation itself. The elastic material behavior is associated with energy storage. The class of polymers known as elastomers exhibit viscoelastic behavior. Elastomer properties typically depend on temperature and frequency of deformation.

For structural damping applications, viscoelastic materials are chosen according to their damping characteristics (viscous behavior), which should be maximized at the operating temperature and the range of frequencies to be damped. In the present application, the temperature range is for example 20–40 C and the frequency range is for example 8–250 Hz.

The wear-resistant material of the viscoelastic spacer is a durable material capable of withstanding cyclical insertion and withdrawal of the storage module over for example 200 wear cycle events without noticeable wear or degradation or change in surface properties of the wear-resistant material. One insertion and one withdrawal are considered to be one wear cycle event. The wear-resistant material also preferably has a low coefficient of friction, for example values of 0.03 to 0.10 with the mating surface of the enclosure 30.

The layer of viscoelastic material 105 and the layer of wear-resistant material 110 are bonded together to form a unitary elastic structure 100. The ISD-112 material has self-adhesive properties. If a non-self-adhesive viscoelastic material is used, a layer of adhesive material 150 may be bonded to the viscoelastic material to form a three-layer unitary structure as shown in FIG. 3, or an adhesive may be applied to the storage module surface to afix the spacer in place. Alternative attachment expediencies may be used.

Figure 4:
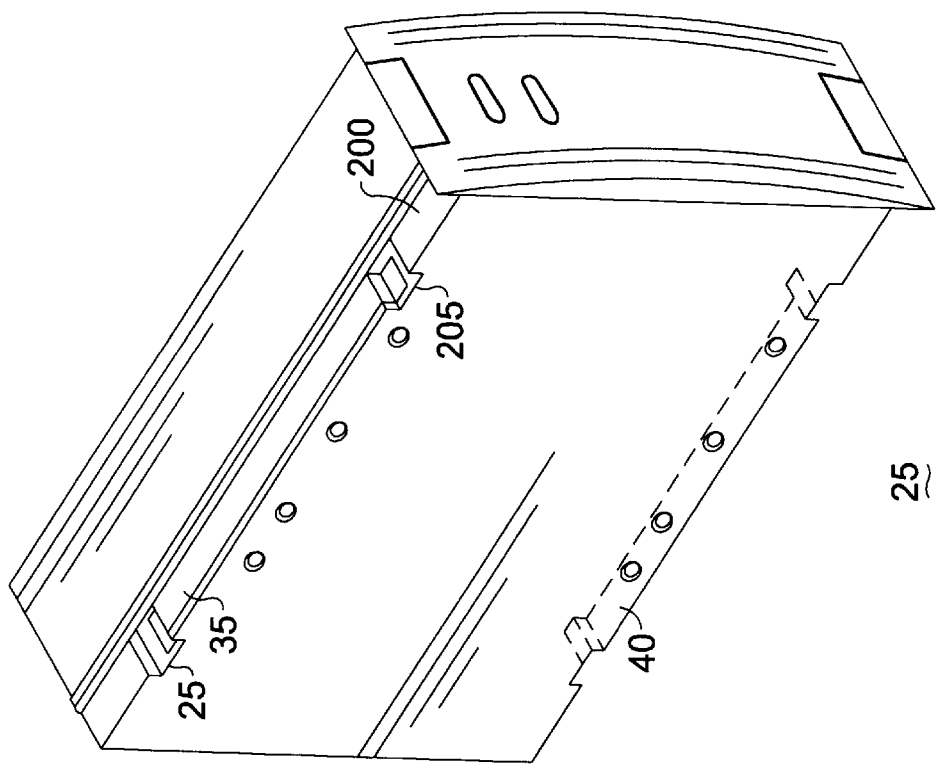
FIG. 4 is an enlarged perspective view of one of the storage modules of FIG. 1 with viscoelastic spacers.

FIG. 4 is an enlarged perspective view of the exemplary storage module 25 of FIG. 1. In the present embodiment of the invention, the first viscoelastic spacer 35 is installed with the viscoelastic layer, or in the alternative, the adhesive layer, against the storage module 25 in a first cut-out 200 in the top of the storage module 25. The first cut-out 200 runs parallel to the direction in which the disk drive 25 slides into the storage subsystem enclosure 30. The first cut-out 200 has a second cut-out 205 and a third cut-out 210 into which the ends of the viscoelastic spacer 35 are depressed below the bottom surface of the first cut-out 200. The second viscoelastic spacer 40 is similarly installed on the bottom of the storage module 25. This configuration of the viscoelastic spacers 35, 40 and storage module 25 allows the storage module 25 to be slidably inserted into the storage subsystem enclosure with the wear resistant layer of the spacers 35, 40 in contact with the enclosure, as will be described below, but without dislodging the viscoelastic spacers 35, 40 from the storage module 25.

Figure 5:
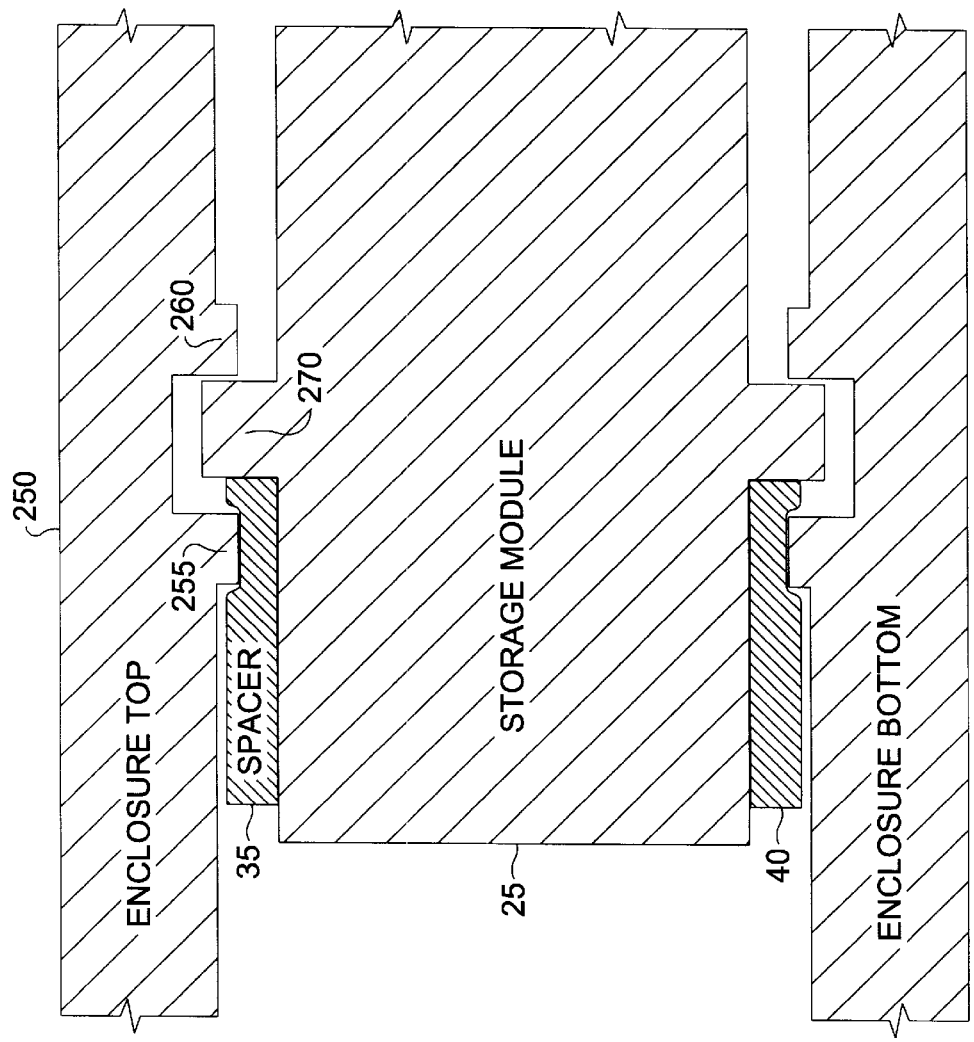
FIG. 5 is a simplified partial front cross-sectional view illustrating the storage module and viscoelastic spacer installed in an enclosure; and, FIG. 6 is a cross-sectional view of the enclosure protrusion and the viscoelastic spacer showing the compression and shear forces in the spacer.

FIG. 5 is a simplified partial front cross-sectional view illustrating the storage module 25, the first viscoelastic spacer 35, and the second viscoelastic spacer 40 installed in the storage subsystem enclosure 30. An enclosure top 250 has a first protrusion 255 and a second protrusion 260. The first protrusion 255 and the second protrusion 260 run from the front, or open, end of the enclosure 30 toward the back for approximately the length of the storage module 25. The storage module 25 has a third protrusion 270 running parallel to the first cut-out 200. The third protrusion 270 runs the length of the storage module 25. The first protrusion 255, the second protrusion 260 and the third protrusion 270 are placed and dimensioned such that they mate and form a rail and guide arrangement for slidable insertion of the storage module 25 into the storage subsystem enclosure 30.

Figure 6:
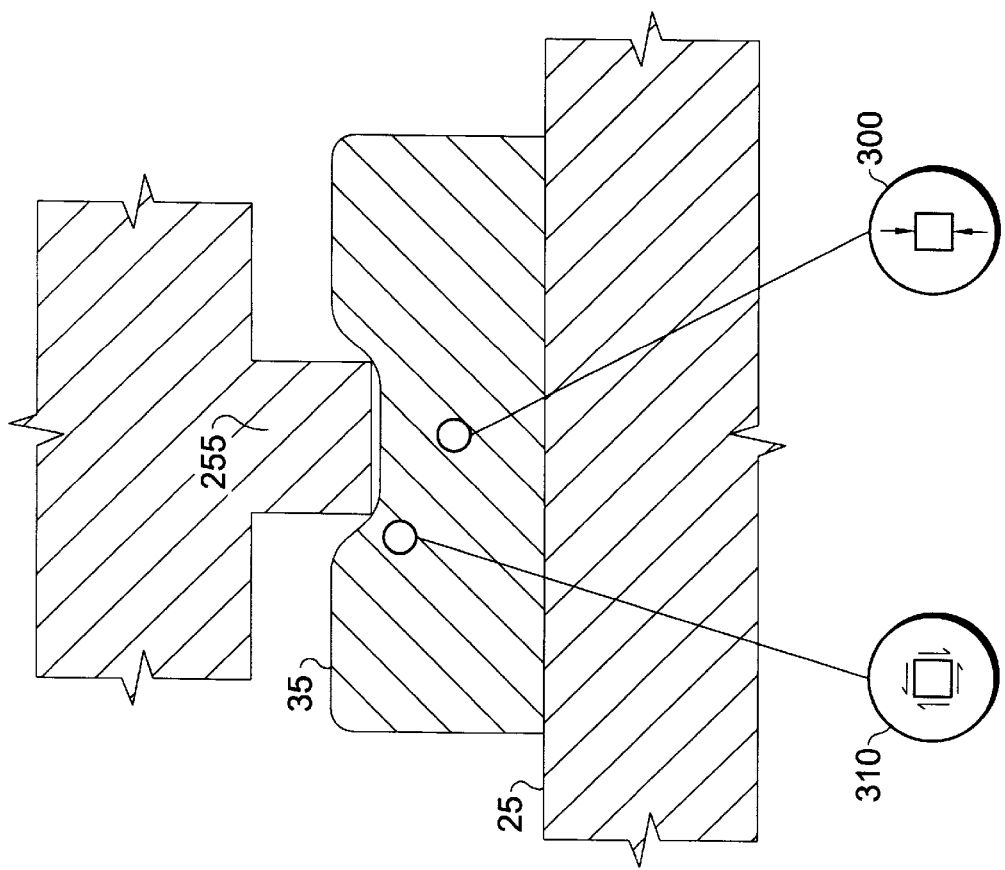

Upon insertion of the storage module 25 into the storage subsystem enclosure 30, the first protrusion 255 engages with the viscoelastic spacer 35. FIG. 6 shows the first protrusion 255, the spacer 35, the storage module 25, and the compression 300 and shear 310 forces in the spacer 35. The compression 300 and shear 310 forces on the spacer 35 are shown in magnified view. The first protrusion 255 preloads the spacer in compression 300. In addition, the spacer 35 conforms to the first protrusion 255 in a manner which subjects the spacer 35 to both compression 300 and shear 310 forces generated by the vibration of the storage module 25 against the enclosure 30. The second spacer 40 is similarly installed at the bottom of the storage module 25. The viscoelastic spacers 35, 40 absorb the vibration and prevent unwanted movement of the storage module 25 by converting the kinetic energy of the motion of the storage module and the storage subsystem caused by vibration into thermal energy.

The embodiment described herein is for a storage module which is slidably inserted into an enclosure, however alternative embodiments may include other means of assembly which cause a viscoelastic spacer to be subjected to both the compression and shear forces of vibration. For example, the storage module and enclosure may be assembled using a "clamshell" arrangement where for example an enclosure lid is lowered over the storage module in the enclosure where the lid provides the protrusion for the compression and shear forces in the spacer. Also, the embodiment described herein has a top spacer and a bottom spacer on only one side of the storage module, however, alternative embodiments may include spacers on both sides of the storage module. Alternative embodiments may also include attaching the spacers to the storage subsystem enclosure rather than to the storage module itself.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. A vibration damping apparatus, comprising:

a layer of viscoelastic material;

a layer of wear-resistant material attached to said layer of viscoelastic material forming a unitary damping structure, said damping structure mounted to an object whose vibrations are to be damped; and, an enclosure including a first protrusion extending therefrom, said first protrusion engaging said damping structure upon insertion of the object into said enclosure such that said damping structure is subjected to any compression and shear forces caused by vibration of the object whereby the damping structure absorbs the vibration by converting the compression and shear forces to thermal energy.

2. The apparatus of claim 1 wherein the viscoelastic material is 3M ISD-112 viscoelastic material.

3. The apparatus of claim 1 wherein the viscoelastic material is 3M VHB material.

4. The apparatus of claim 1 wherein the wear-resistant material also has a low coefficient of friction.

5. The apparatus of claim 1 wherein said object is an electromechanical storage device.

6. The apparatus of claim 1 wherein said damping structure is preloaded in compression.

7. The apparatus of claim 1, further comprising a second damping structure mounted to the object and wherein said enclosure further comprises a second protrusion extending therefrom that engages said second damping structure upon insertion of the object into the enclosure, such that said second damping structure is subjected to any compression and shear forces caused by vibration of the object whereby the second damping structure absorbs the vibration by converting the compression and shear forces to thermal energy.

8. A vibration damping apparatus for damping the vibrations of a storage module slidably installed in an enclosure, comprising:

a first viscoelastic spacer attached to the top of the storage module and a second viscoelastic spacer attached to the bottom of the storage module, said first and said second spacer each having a layer of viscoelastic material and a layer of wear-resistant material, said layer of viscoelastic material bonded to the storage module; and, a first protrusion and a second protrusion positioned on inner walls of the enclosure such that said first protrusion engages with said first viscoelastic spacer and said second protrusion engages with said second viscoelastic spacer upon insertion of the storage module into the enclosure.

9. The apparatus of claim 8 where said first and said second spacers are subjected to any compression and shear forces caused by vibration, said first and second spacers absorbing the vibration by converting the kinetic energy of the relative motion of the storage module and enclosure to thermal energy.

* * * * *